United States Patent [19]
Yang

[11] Patent Number: 5,918,123
[45] Date of Patent: Jun. 29, 1999

[54] METHOD FOR FABRICATING CAPACITOR OF SEMICONDUCTOR DEVICE

[75] Inventor: Doo Young Yang, Chungcheongbuk-do, Rep. of Korea

[73] Assignee: LG Semicon Co., Ltd., Chungcheongbuk-Do, Rep. of Korea

[21] Appl. No.: 08/961,265

[22] Filed: Oct. 30, 1997

[30] Foreign Application Priority Data

Jul. 29, 1997 [KR] Rep. of Korea ........................ 97-35826

[51] Int. Cl.$^6$ ................................................ H01L 21/8242
[52] U.S. Cl. ........................... 438/253; 438/287; 438/672
[58] Field of Search ........................... 438/287, 250–256, 438/393–399, 238–240, 381

[56] References Cited

U.S. PATENT DOCUMENTS 5,330,614  7/1994  Ahn .
5,714,415  2/1998  Oguro .................................... 438/486

OTHER PUBLICATIONS

T. Eimori et al., "A Newly Designed Planar Stacked Capacitor Cell with High dielectric Constant Film for 256Mbit DRAM", IEDM Technical Digest, 1993 IEEE, pp. 631–634.

Kuniaki Koyama et al., "A Stacked Capacitor with $(Ba_x Sr_{1-x})TiO_3$ For 256M DRAM", IEDM Technical Digest, 1991 IEEE, pp. 823–826.

*Primary Examiner*—Jey Tsai
*Attorney, Agent, or Firm*—Morgan, Lewis & Bockius LLP

[57] ABSTRACT

A method for fabricating a capacitor of a semiconductor device in which its process is simplified and capacitance is efficiently improved is disclosed, including the steps of preparing a semiconductor substrate equipped with a transistor; forming a plug electrically connected to an impurity region of the transistor; forming a Si—H boding layer on surface of the plug; detaching H ions from the Si—H bonding layer so as to form a $SiO_x$ layer; and forming an electrode over the plug.

20 Claims, 5 Drawing Sheets

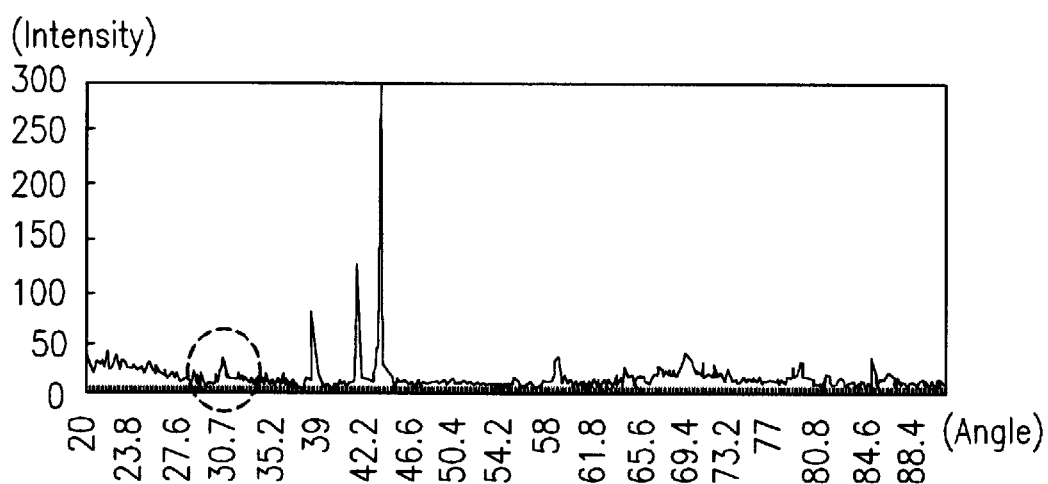
XRD pattern of a sample annealed at 650°C for 30 mimutes after depositing Ru at 300°C
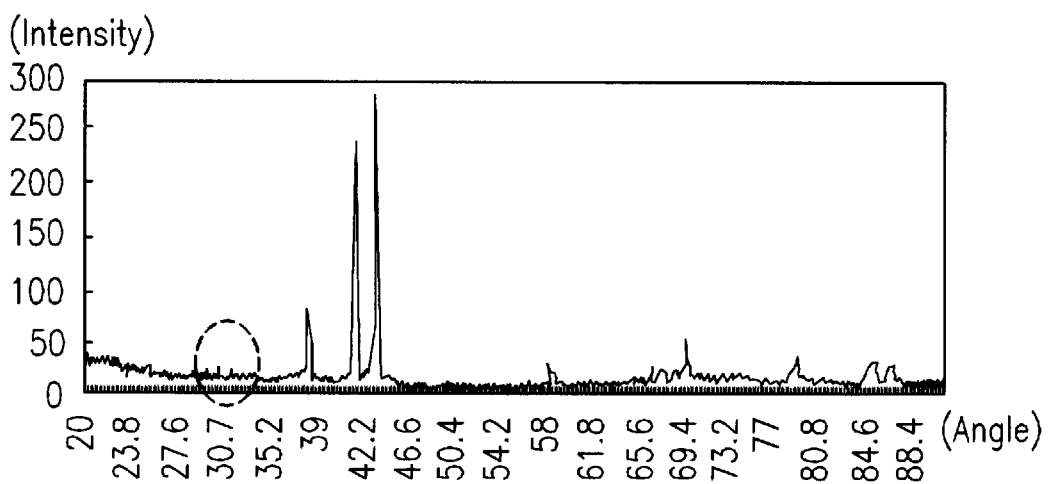
XRD pattern of a sample annealed at 650°C for 30 mimutes after depositing Ru at 300°C after annealing at 600°C to detach hydrogen

METHOD FOR FABRICATING CAPACITOR OF SEMICONDUCTOR DEVICE

BACKGROUND OF THE INVENTION

1. Field of the Invention

The present invention relates to a semiconductor device and, more particularly, to a method for fabricating a capacitor of a semiconductor device in which its process is simplified and capacitance is efficiently improved.

2. Discussion of the Related Art

Miniaturization and integrity density of electrical circuits are realized due to development of fabricating technology of semiconductor devices. For example, mass production of 16M DRAMs (dynamic random access memories) and 64M DRAMs has been proceeded. Moreover, research and development is being directed to DRAMs with a higher integrity density.

As integrity densities of devices increase, areas for capacitors of cells drastically decrease. Thus, the major issues to improve integrity density of DRAMs are capacitor-fabricating technologies capable for realizing capacitors with equivalent capacitance even in reduced areas of capacitors.

A conventional method for fabricating a capacitor of a semiconductor device will be described with reference to the accompanying drawings.

FIG. 1 is a cross-sectional view showing a structure of a conventional capacitor.

High dielectric constant materials, i.e., $BaSrTiO_3$ (BST), $BaTiO_3$, $PbZrTiO_3$ (PZT), and $PbZrO_3$ have been strongly proposed in fabricating methods of capacitors.

A conventional capacitor for which high dielectric constant material is used includes a well 2 formed in a semi-conductor substrate 1; device-isolating layers 3 formed on the well 2; a gate electrode 5a, 5b, and 5c formed on a channel region in each of active regions isolated by device-isolating layers 3; impurity diffusion regions 4 used as source and drain regions formed by an impurity ion-implanting process with the gate electrode 5a, 5b, and 5c serving as a mask; a first interlayer insulating layer 6 formed on the entire surface of the semiconductor substrate 1 to have a contact hole; a bit line 7 consisting of a polysilicon plug layer 7a and a silicide layer 7b formed on the poly-silicon plug layer 7a, wherein the polysilicon plug layer contacts with the impurity diffusion region 4 at one side of the gate electrode 5a, 5b, and 5c through the contract hole of the first interlayer insulating layer 6; a second interlayer insulating layer 8 formed on the entire surface including the bit line 7; a lower electrode layer 9 consisting of a polysili-con plug layer 9a, a barrier layer 9b formed on the poly-silicon plug layer 9a, and a metal electrode layer 9c formed on the barrier layer 9b, wherein the polysilicon plug layer 9a contacts with the impurity diffusion region 4 at the other side of the gate electrode 5a, 5b, and 5c through the contact hole of the first and second interlayer insulating layers 6 and 8.

High dielectric constant films are used to heighten capacitance in the above-described capacitor of a semiconductor device. However, the capacitor has the following problems.

First, a silicon oxide film is formed at interface of a polysilicon electrode and a high dielectric constant film in case that a polysilicon layer is used as an electrode of a capacitor, thereby deteriorating device performances.

Second, since a deposition temperature of a high dielectric constant film is about 600–700° C., a material for electrodes should have a high melting point and oxidation resistance. In other words, the range of materials used as electrodes is limited. There should be used only materials such as Pt, Pd, Rh, RuO, $IrO_2$ which are not oxidized. Accordingly, improvement of electrode structure and development of its process should be accomplished in order to use a high dielectric constant material for a capacitor.

In the typical structure of a conventional electrode, there is formed a contact plug layer made of polysilicon, upon which there is formed a metal electrode made of Pt that has a good conductivity and is not oxidized. In this case, since there exists an interface of the contact plug layer and the metal electrode, a considerable amount of silicide nuclear is generated by reaction of the metal and the silicon. Besides, due to annealing process after depositions of a dielectric film of a capacitor, an insulating layer for wiring, and so forth, they are easily converted to silicide. This reaction of conversion into silicide causes changes in volume of the lower electrode, thereby generating void, crack, and stress. Silicide is characterized in being easily oxidized so that the entire metal lower electrtode becomes thin. In order to solve this problem, barrier metal layer against oxidation or reaction has been used.

However, formation of such barrier metal layers increase production cost and make the process complex. Further, mutual diffusion of elements at the interface can not be controlled completely.

SUMMARY OF THE INVENTION

Therefore, the present invention is directed to a method for fabricating a capacitor of a semiconductor device that substantially obviates one or more of problems due to limitations and disadvantages of the related art.

An object of the invention is to provide a method for fabricating a capacitor of a semiconductor device in which the process and the electrode structure are simplified and the capacitance is efficiently improved.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a capacitor of a semiconductor device includes the steps of preparing a semiconductor substrate equipped with a transistor; forming a plug electrically connected to an impurity region of the transistor; forming a Si—H boding layer on surface of the plug; detaching H ions from the Si—H bonding layer so as to form a $SiO_x$ layer; and forming an electrode over the plug.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIGS. 3A and 3B are graphs showing XRD (X-ray diffraction) patterns in accordance with the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2I are cross-sectional views showing process steps of a method for fabricating a capacitor in accordance with a preferred embodiment of the present invention and FIGS. 3A and 3B are graphs showing XRD patterns in accordance with the present invention.

In accordance with the present invention, it is possible to realize a capacitor having a high dielectric constant film without an extra film functioning as an oxidation-preventing film of a polysilicon layer or a diffusion-preventing film between a lower electrode of a capacitor and a polysilicon plug electrically connected to the source and drain of a cell transistor.

Figure 1:
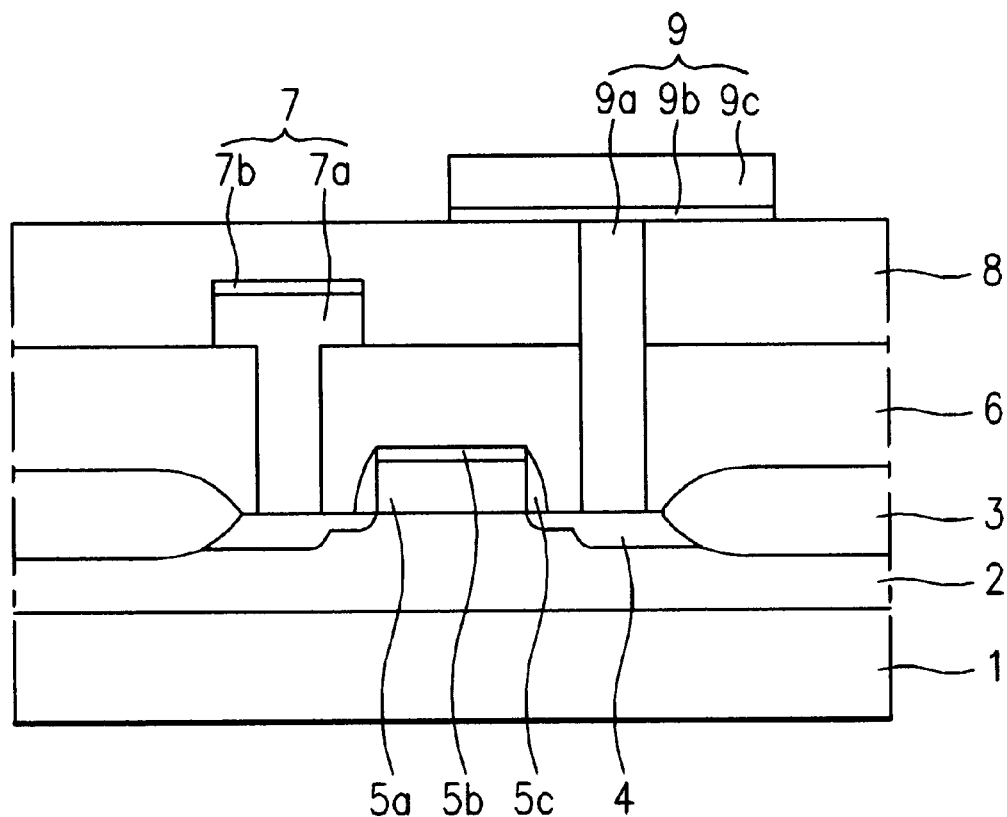
FIG. 1 is a cross-sectional view showing a structure of a conventional capacitor.
Figure 2A:
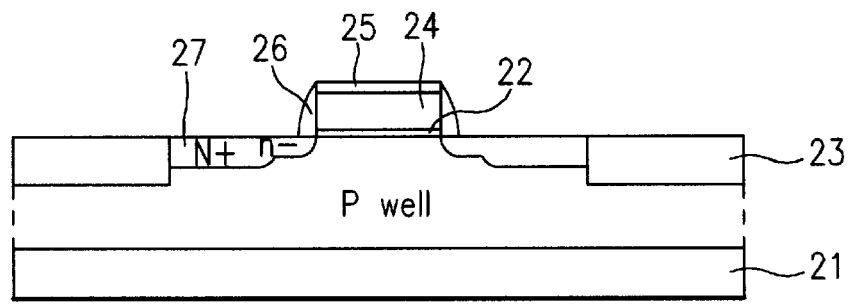
FIGS. 2A to 2I are cross-sectional views showing process steps of a method for fabricating a capacitor in accordance with a preferred embodiment of the present invention.

Referring initially to FIG. 2A, device-isolating layers 23 are selectively formed in device-isolating region of a semiconductor substrate 21 in which there is a well formed. Subsequently, a gate insulating layer 22 is formed to have a thickness of 80 Angstroms (±10%) on the surface of the semiconductor substrate 21 by a thermal oxidation process in a furnace. A polysilicon layer or an amorphous silicon layer is formed to have a thickness of 2000 Angstroms (±10%) in a low pressure chemical vapor deposition (LPCVD) method. Then, an oxide layer is deposited on the polysilicon layer or the amorphous silicon layer to have a thickness of 1500 Angstroms (±10%) in an LPCVD method.

Next, the oxide layer and the polysilicon layer or the amorphous silicon layer are selectively etched to form a gate electrode 24 and the cap oxide layer 25. Thereafter, in order to form lightly doped impurity diffusion regions, P ions are implanted under the conditions of $2.4 \times 10^{13}/cm^2$ and 40 Kev(±10%) with the gate electrode 24 serving as a mask, and an oxide layer into which impurity ions are not doped is formed on the entire surface of the semiconductor substrate 21 on which there is the gate electrode 24 formed, and the oxide layer is anisotropically etched by a reactive ion etching (RIE) process, thus forming gate sidewall spacers 26 on sides of the gate electrode 24.

Subsequently, $As^{30}$ ions are implanted under conditions of $5 \times 10^{15}/cm^2$ and 40 Kev (±10%) with the gate electrode 24 and the sidewall spacers serving as masks, thus forming heavily doped impurity diffusion regions. Then, an annealing process is performed at 850° C. for 30 min (±10%), thus forming source and drain regions 27 having a lightly doped drain (LDD) structure.

Figure 2B:
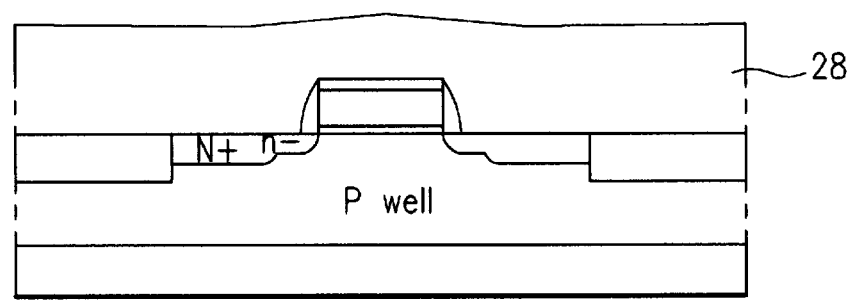

Referring to FIG. 2B, a first interlayer insulating layer 28 is formed on the entire surface of the semiconductor substrate 21 to have a thickness of about 4000 Angstroms (±10%). In this case, the first interlayer insulating layer is made of boron phosphorus silicate glass (BPSG) or Tetra-EthylOrthoSilicate (TEOS), which has a good planarization characteristic.

Figure 2C:
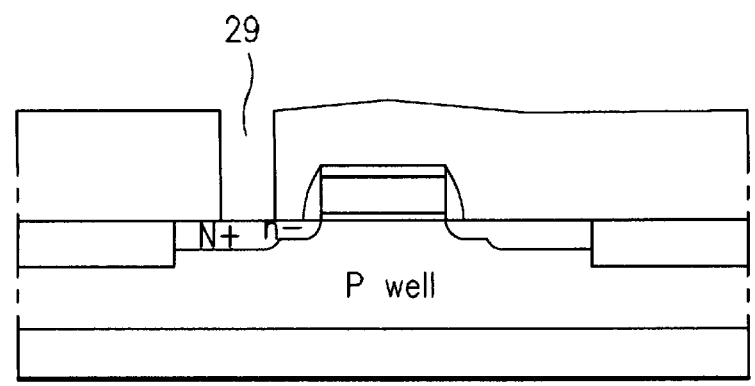

Referring to FIG. 2C, a photoresist film (not shown) is coated on the first interlayer insulating layer 28 and then selectively patterned. With the photoresist pattern as a mask, the first interlayer insulating layer 28 is selectively removed to form a contact hole 29. At this time, the first interlayer insulating layer 28 is selectively etched by an RIE method using a plasma with $CHF_3$ and $CF_4$, so as to expose a predetermined area of the semiconductor substrate 21.

Figure 2D:
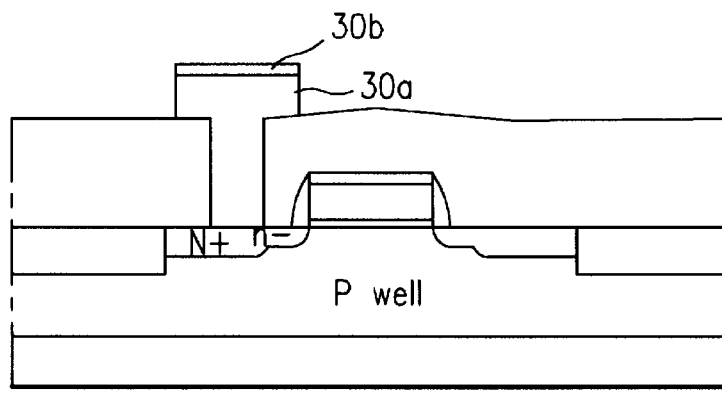

Referring to FIG. 2D, an LPCVD process is performed over the entire surface including the contact hole 29 so as to deposit a polysilicon layer or an amorphous silicon layer having a thickness of 2000 Angstroms (±10%). Subsequently, a metal silicide layer made of a metal with a high melting point, e.g., W is deposited on the polysilicon layer or the amorphous silicon layer by a chemical deposition process to have a thickness of 1000 Angstroms (±10%). At this time, the polysilicon layer or the amorphous silicon layer contacts the impurity diffusion region at one of the sides of the cell transistor. Next, the metal silicide layer and the polysilicon layer or the amorphous silicon layer are selectively etched to form a bit line 30a and 30b.

Figure 2E:
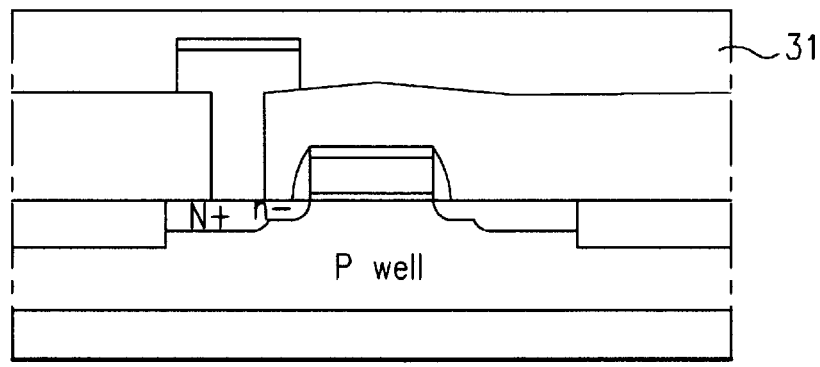

Referring to FIG. 2E, TEOS or BPSG having a thickness of 6000 Angstroms (±10%) is coated on the entire surface including the bit line 30a and 30b, thus forming a second interlayer insulating layer 31.

Figure 2F:
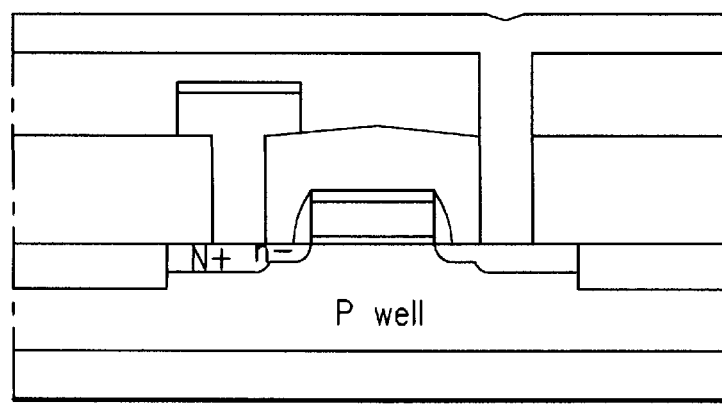

Referring to FIG. 2F, the first and second interlayer insulating layer 28 and 31 are selectively removed over the impurity diffusion region at the other side of the cell transistor, so as to form a storage node contact hole. In this case, the first and second interlayer insulating layers 28 and 31 are etched by an RIE process using a plasma with $CHF_3$ and $CF_4$. Then, an LPCVD process is performed over the entire surface including the storage node contact hole so as to form a polysilicon layer or an amorphous silicon layer having a thickness 1500 Angstroms (±10%).

Figure 2G:
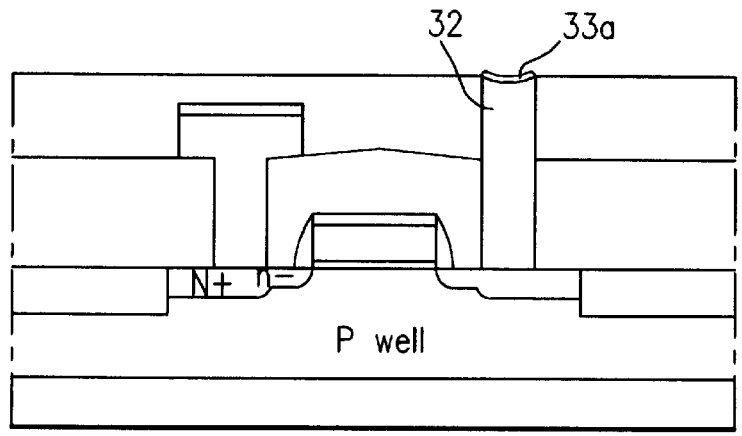

Referring to FIG. 2G, the polysilicon layer or the amorphous silicon layer is subject to an etch back process to form a plug 32. In order to cover the dangling bond of Si atoms of the surface of the plug 32 with hydrogen atoms, the substrate is dipped into HF aqueous solution to make a Si—H bonding layer 33a planarized.

Figure 2H:
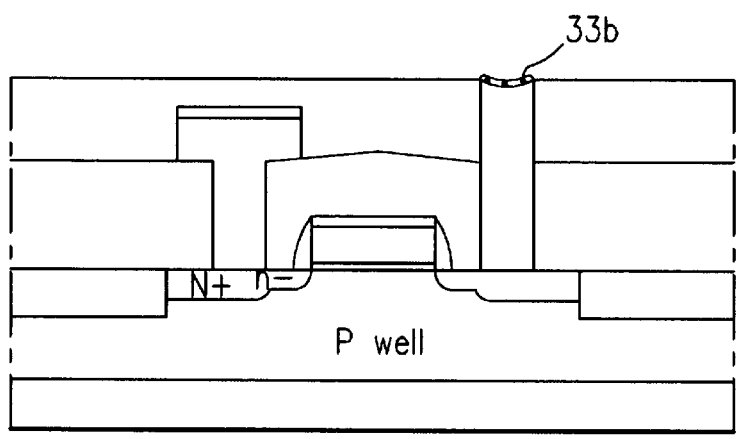

Referring to FIG. 2H, the wafer is put into a vacuum chamber and heated under less than $10^{-6}$ torr at 420–600° C. so that hydrogen ions are detached from the surface of the plug 32 so as to form a $SiO_x$ layer 33b.

Figure 2I:
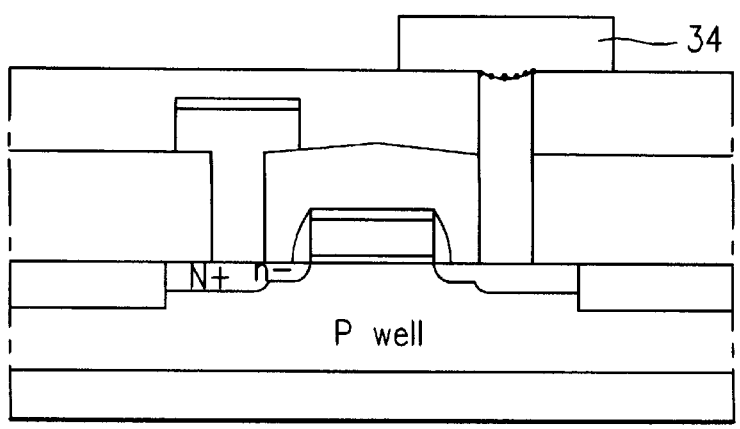

Referring to FIG. 2I, a metal layer made of, e.g., Pt or Ru is deposited on the entire surface including the plug layer 32 and then is selectively etched to form a lower electrode 34 defining a capacitor area. Next, a high dielectric constant film made of e.g., BST, PZT, or SBT having a thickness of about 500 Angstroms (±10%), not shown, is deposited by an MOCVD process or a sputtering process, and then a metal layer having a thickness of about 1000 Angstroms (±10%) is formed, thereby completing a capacitor.

After detaching hydrogen ions, hydrogen ions are substituted with oxygen ions under less oxygen partial pressure of less than $10^{-6}$ torr, thus forming the $SiO_x$ layer 33b which has a form of a single film. This $SiO_x$ layer 33b is stable at a temperature required in a following process of depositing and crystallizing a high ferroelectric film.

In a method for fabricating the aforementioned capacitor, the surface of a plug layer 32 made of polysilicon or amorphous silicon is subject to HF treatment to form a Si—H boding layer 33a on the surface of the plug layer 32, and then is covered with hydrogen atoms. This Si—H bonding layer 33a is used an oxidation-preventing layer in a vacuum surrounding. At a temperature at which a metal layer is deposited, the Si—H bonding layer 33a is destroyed so that hydrogen ions are substituted with oxygen ions which have a better affinity to Si than hydrogen ions do, thereby forming a SiOX layer 33b in a form of either single layer or of bilayer. This layer serves to prevent oxidation proceeding drastically in an oxide surrounding in a following process. Besides, in case that the high ferroelectric constant film is crystallized or that it is annealed at a temperature of higher than 750° C. required for glass reflow for planarization, the $SiO_x$ layer 33b at the interface is destroyed, thereby connecting the plug layer 32 with the metal. In this $SiO_x$ layer 33b, there are no problems concerning adjustment of thickness and electrical connection that are caused in a natural oxide layer.

FIG. 3A shows XRD patterns after an annealing process for 30 minutes at a temperature of 650° C. which is performed after deposition of Ru at a temperature of 300° C. after the formation of a plug layer. FIG. 3B shows XRD patterns after an annealing process for 30 minutes at a temperature of 600° C. which is performed after deposition of Ru at a temperature of 300° C. (±10%) after hydrogen ions are detached by an annealing process at a temperature of 600° C. The XRD patterns serve to detect new crystal phases and orientations of the metal of a lower electrode. The X axes of FIGS. 3A and 3B represent for incident angle (2θ) of X-ray and the Y axes for a diffraction intensity of X-ray.

While the presence of sulicide at about an angle of 30.7 is shown in FIG. 3A, it is not in FIG. 3B. Yet, the (002) crystal at about an angle of 42.2 is developed very well. The (002) crystal at around an angle of 42.2 shown in FIG. 3B affects the crystal growth of a high dielectric constant film in a following process in a good way.

A method for fabricating a capacitor of a semiconductor device of the present invention has the following advantages. Since a $SiO_x$ layer is formed at the interface of a polysilicon contact plug and a lower electrode of a capacitor, there is no bad contacting caused at the interface. Thus, the production cost and the overall process are reduced compared to a conventional method in which there is used as an oxidation or reaction preventing layer having a form of either a single layer or a bilayer. Further, since it is possible to completely control the mutual diffusion of elements at the interface, the reliability of devices is enhanced and the process tolerance is increased. That is, the structure of electrodes are simplified and the capacitance is effectively improved.

It will be apparent to those skilled in the art that various modification and variations can be made in the method for fabricating a capacitor of a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for fabricating a capacitor of a semiconductor device comprising the steps of:

preparing a semiconductor substrate equipped with a transistor;

forming a plug electrically connected to an impurity region of the transistor;

forming a Si—H boding layer on surface of the plug;

detaching H ions from the Si—H bonding layer so as to form a $SiO_x$ layer; and forming an electrode over the plug.

2. The method as claimed in claim 1, wherein the Si—H bonding layer is formed by dipping the semiconductor substrate into HF aqueous solution.

3. The method as claimed in claim 1, wherein the $SiO_x$ layer is formed by detaching hydrogen ions from the Si—H bonding layer by an annealing process performed under a pressure of less than $10^{-6}$ torr at a temperature of 420° C.–600° C.

4. The method as claimed in claim 1, wherein the plug and the electrode are electrically connected to each other by destroying the $SiO_x$ layer by another annealing process.

5. The method as claimed in claim 4, wherein the annealing process is performed at a temperature of higher than 750° C.

6. A method for fabricating a capacitor of a semiconductor device comprising the steps of:

forming an insulating layer on a semiconductor substrate equipped with a transistor;

selectively removing the insulating layer to expose an impurity region of the transistor, so as to form a contact hole;

forming a plug layer in the contact hole;

forming a Si—H bonding layer on surface of the plug layer;

detaching hydrogen ions from the Si—H bonding layer so as to form a $SiO_x$ layer; and forming an electrode over the plug layer.

7. The method as claimed in claim 6, wherein, on the insulating layer including the contact hole, a silicon layer is formed and then etched back, so as to form the plug layer.

8. The method as claimed in claim 7, wherein the silicon layer is made of either polysilicon or amorphous silicon.

9. The method as claimed in claim 6, wherein the insulating layer is made of either boron phosphorus silicate glass (BPSG) or TetraEthylOrthoSilicate (TEOS).

10. The method as claimed in claim 6, wherein the Si—H bonding layer is formed by dipping the semiconductor substrate into HF aqueous solution.

11. The method as claimed in claim 6, wherein the $SiO_x$ layer is formed by detaching hydrogen ions from the Si—H bonding layer by an annealing process performed under a pressure of less than $10^{-6}$ torr at a temperature of 420° C.–600° C.

12. The method as claimed in claim 6, wherein the plug and electrode are electrically connected to each other by destroying $SiO_x$ layer by another annealing process.

13. The method as claimed in claim 12, wherein the annealing process is performed at a temperature of higher than 750° C.

14. The method as claimed in claim 12, wherein the annealing process is performed in crystallizing a dielectric film or in glass reflow for planarization.

15. A method for fabricating a capacitor of a semiconductor device, comprising the steps of:

forming a first insulating layer on a semiconductor substrate equipped with a transistor;

selectively removing the first insulating layer to expose a first impurity region of a transistor, so as to form a first contact hole;

forming a bit line on the first insulating layer including the first contact hole;

forming a second insulating layer on the first insulating layer including the bit line;

selectively removing the first and second insulating layer to expose a second impurity region of the transistor, so as to form a second contact hole;

forming a plug in the second contact hole;

forming a Si—H bonding layer on surface of the plug;

detaching hydrogen ions from surface of the Si—H bonding layer to form a $SiO_x$ layer; and forming a lower electrtode over the plug.

16. The method as claimed in claim 15, further comprising the steps of:

forming a dielectric film on the lower electrode; and forming an upper electrode on the dielectric film.

17. The method as claimed in claim 15, wherein the Si—H bonding layer is formed by dipping the semiconductor substrate into HF aqueous solution.

18. The method as claimed in claim 15, wherein the $SiO_x$ layer is formed by detaching hydrogen ions from the Si—H bonding layer by an annealing process performed under a pressure of less than $10^{-6}$ torr at a temperature of 420° C.–600° C.

19. The method as claimed in claim 15, wherein the plug and the electrode are electrically connected to each other by destroying the $SiO_x$ layer by another annealing process.

20. The method as claimed in claim 19, wherein the annealing process is performed at a temperature of higher than 750° C.

* * * * *